US007292110B2

United States Patent
Lee (10) Patent No.: US 7,292,110 B2
(45) Date of Patent: Nov. 6, 2007

(54) SELF-TEST DIGITAL PHASE-LOCKED LOOP AND METHOD THEREOF

(75) Inventor: Ming-Fuo Lee, Hsin Chu (TW)

(73) Assignee: Etron Technology, Inc., Hsin Chu (TW)

( * ) Notice: Subject to any disclaimer, the term of this patent is extended or adjusted under 35 U.S.C. 154(b) by 36 days.

(21) Appl. No.: 11/294,391

(22) Filed: Dec. 6, 2005

(65) Prior Publication Data

US 2007/0126513 A1    Jun. 7, 2007

(51) Int. Cl.
*H03L 7/085* (2006.01)
(52) U.S. Cl. .................. 331/44; 331/1 A; 375/376
(58) Field of Classification Search ......... 331/1 A, 331/44; 375/376
See application file for complete search history.

(56) References Cited

U.S. PATENT DOCUMENTS

2004/0146098 A1*  7/2004  Eliezer et al. ............. 375/227
2004/0146132 A1*  7/2004  Staszewski et al. ........ 375/376

\* cited by examiner

*Primary Examiner*—Joseph Chang
(74) *Attorney, Agent, or Firm*—Birch, Stewart, Kolasch & Birch, LLP (57) ABSTRACT

A phase-locked loop (PLL) apparatus utilizes a digital control unit to perform a stable phase-locking and self-testing. The PLL circuit internally generates a set of digital parameters. The set of digital parameters are configured to be as the basis of testing. Therefore, the PLL can be tested by a digital way instead of an analog way. In addition, a method of locking a PLL includes three operating modes, and the data capture circuit captures some data generated by phase-locked loop (PLL) during these operation.

16 Claims, 8 Drawing Sheets

SELF-TEST DIGITAL PHASE-LOCKED LOOP AND METHOD THEREOF

BACKGROUND OF THE INVENTION

1. Field of the Invention

The present invention relates to a phase-locked loop (PLL), and more especially, to a self-test PLL and method thereof.

2. Background of the Related Art

With the development of technology, circuit design has been evolved from single chip to SOC chip. For IC of mixing signals or SOC, phase-locked loop (PLL) is essential and applied to LCD controller, video decoder, etc. It is necessary for testing to consider the difference between analog circuit and digital circuit. However, the conventional testing of PLL is executed in the way of analog test machine.

Figure 1:
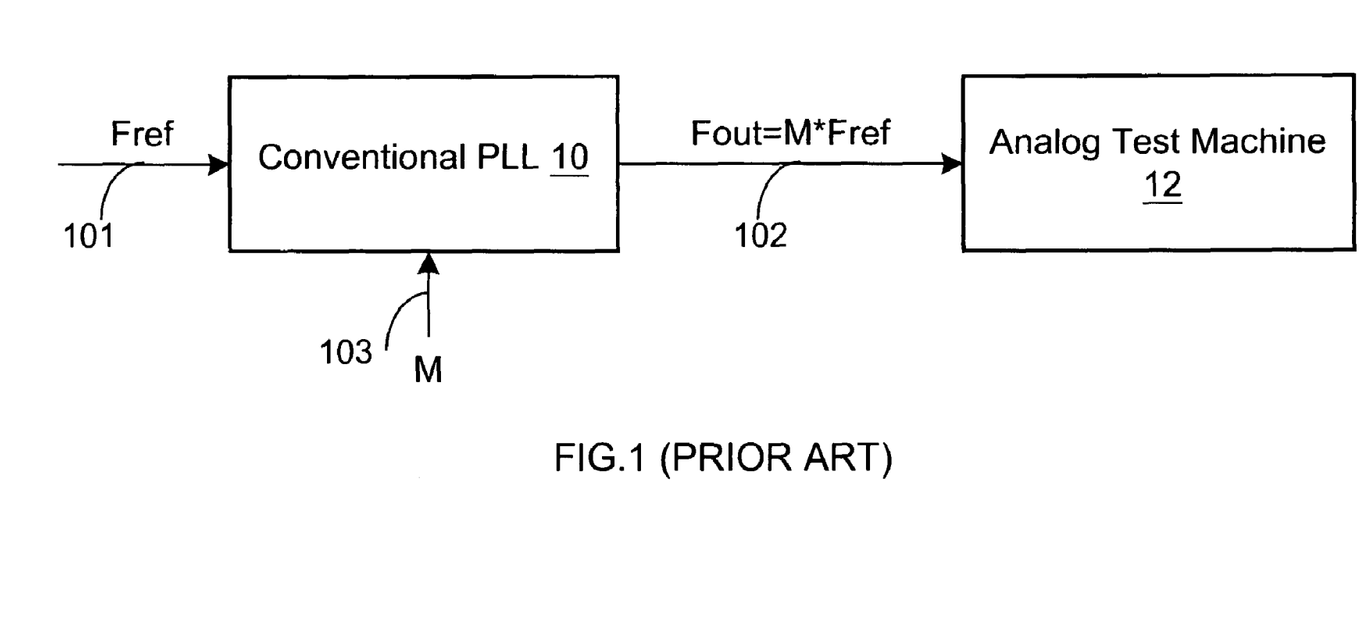
FIG. 1 is a block diagram of a conventional phase-locked loop (PLL).

The phase-locked loop (PLL) block is a feedback control system that automatically adjusts the phase and frequency of a locally generated signal to match the phase and frequency of an input signal. FIG. 1 is a block diagram of a conventional phase-locked loop (PLL). A conventional PLL 10 receives the input signal 101(Fref) and multiplies its frequency by 103(M), for example, an integer, then outputs the output signal 102(Fout). The output signal 102 is sent to an external analog test machine 12 to measure the performance of PLL, for example, jitter, frequency, error, etc. For measuring these characteristics, a complicated testing machine is required that causes the high manufacturing cost and time consuming.

SUMMARY OF THE INVENTION

In order to solve the problems mentioned above, a self-test digital phase-locked loop (PLL) is provided for judging some digital data during the PLL's operation without implementing large testing circuits embedded in the PLL circuit.

Accordingly, one embodiment of the present invention provides the method of self-test digital phase-locked loop (PLL) using locking mechanism to produce information referring to phase adjustment and frequency adjustment. The method also can test whether the PLL is in an operable mode based on digital parameters internally generated by the PLL.

Accordingly, another embodiment of the present invention provides a PLL circuit internally generating a set of digital parameters and a data capture circuit selectively capturing the set of digital parameters based on a set of criteria.

In one aspect of the invention, a self-test digital phase-locked loop is implemented that offers considerable cost advantages over conventional testing method.

In another aspect of the invention, a self-test digital phase-locked loop is implemented that provides a great deal of flexibility for adjusting the frequency and phase associated with three modes by making and controlling various digital parameters.

In yet another aspect of the invention, a self-test digital phase-locked loop is implemented such that the bugs in the circuits can be pin down by analyzing the digital data wherein the debugging of circuits becomes easy and non-tedious.

In still another aspect of the invention, a self-test digital phase-locked loop is implemented having the control circuitry in digital form suitable for implementation in an ASIC chip.

DETAILED DESCRIPTION OF THE INVENTION

Figure 2:
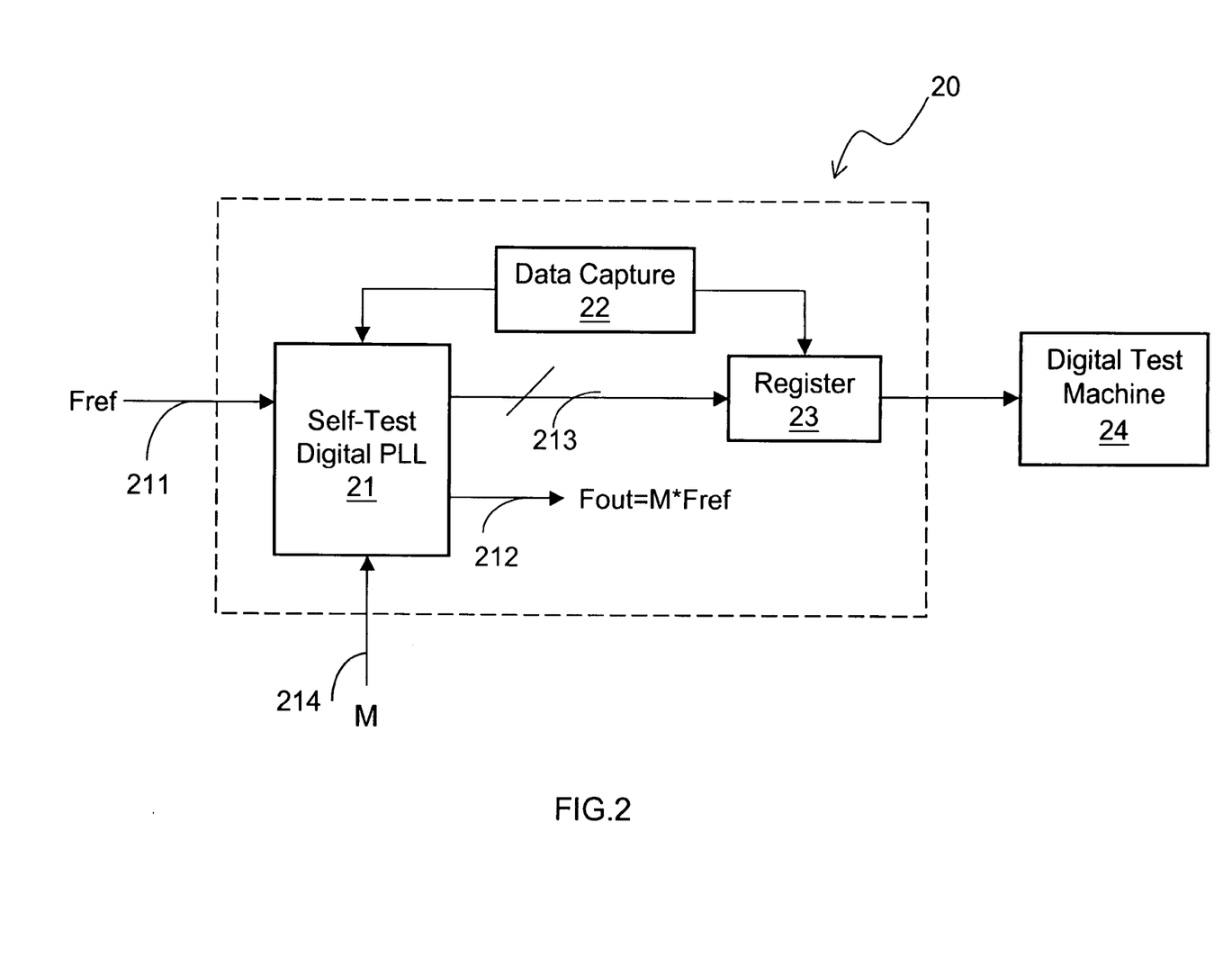
FIG. 2 is a block diagram of a digital phase-locked loop (PLL) in accordance with one embodiment of the present invention.

FIG. 2 is a schematically block diagram of a digital phase-locked loop (PLL) in accordance with one embodiment of the present invention. The digital phase-locked loop (PLL) 20 includes a self-test digital PLL circuit 21 and a register 23 used by a data capture circuit 22. In one embodiment, the self-test digital PLL circuit 21 receives an input signal 211(Fref) and multiplies its frequency by 214(M), for example, an integer, then outputs the output signal 212(Fout) and generates a set of digital parameters 213. In the embodiment, the digital parameters 213, not limited to, may be initial values, frequency gain, phase gain, flags, jitter, frequency, control signals, etc. The register 23 is configured for receiving and storing the digital parameters 213. The data capture circuit 22 is configured for coordinating the self-test digital PLL circuit 21 and the register 23 to selectively capturing the set of digital parameters 213 based on a set of criteria. Using the digital parameters 213 in the register 23, an external digital test machine 24 may test whether the PLL is in an operable mode based on these sets of digital parameters 213 internally generated by the digital PLL 20.

Figure 3:
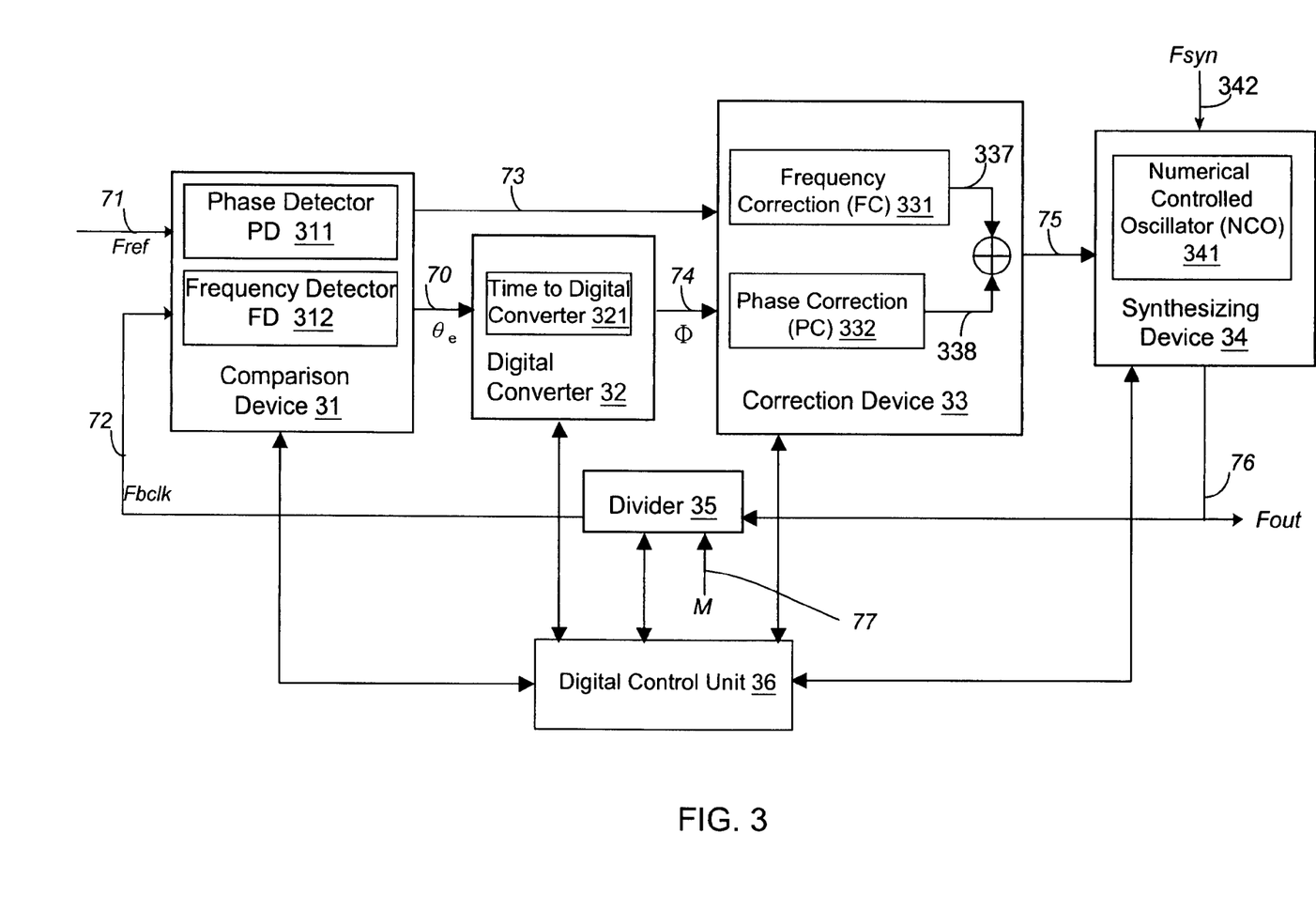
FIG. 3 is a circuit diagram further illustrating a self-test digital phase-locked loop (PLL) shown in FIG. 2 in accordance with one embodiment of the present invention.

FIG. 3 is a circuit diagram further illustrating a self-test digital PLL circuit 21 shown in FIG. 2 in accordance with one embodiment of the present invention. The self-test digital PLL circuit includes a comparison device 31 for comparing an input reference signal 71 (Fref) with an internal feedback signal 72 (Fbclk) and outputting a phase error signal 70 ($\theta_e$) and a controlling digital signal 73 (such as ADD/SUB signal, a first controlling digital signal), a digital converter 32 connects the comparison device 31 for quantizing the phase error signal 70 into a controlling digital signal 74($\Phi$) (a second controlling digital signal), a correction device 33 connects the comparison device 31 and the digital converter 32 for receiving both controlling digital signals 73 and 74, then generating a controlling digital signal 75 (a third controlling digital signal), a synthesizing device 34 connects the correction device 33 for generating the output signal 76 of the self-test digital PLL circuit based on the controlling digital signal 75 generated by the correction device 33, and a divider 35 connects the synthesizing device 34 and the comparison device 31 for receiving the output signal 76 and a divisor 77 (M), then generating the internal feedback signal 72(Fbclk).

Furthermore, a digital control unit 36 connects the comparison device 31, the digital converter 32, the correction device 33, the synthesizing device 34 and the divider 35 for controlling these components depending on the settings of the PLL. The digital control unit 36 marshals these sub-blocks to implement the different modes of operation and output the set of digital parameters based on a set of criteria.

In one embodiment, the comparison device 31 includes a phase detector 311 detecting the phase difference between the input reference signal 71 with the internal feedback signal 72, and a frequency detector 312 detecting the frequency difference between the input reference signal 71 and the internal feedback signal 72. Furthermore, the comparison device 31 outputs the phase error signal 70 and the controlling digital signal 73 based on the detected phase difference and the detected frequency difference. The controlling digital signal 73 is used to selectively increase or decrease the phase or frequency of an internal feedback signal.

Figure 4:
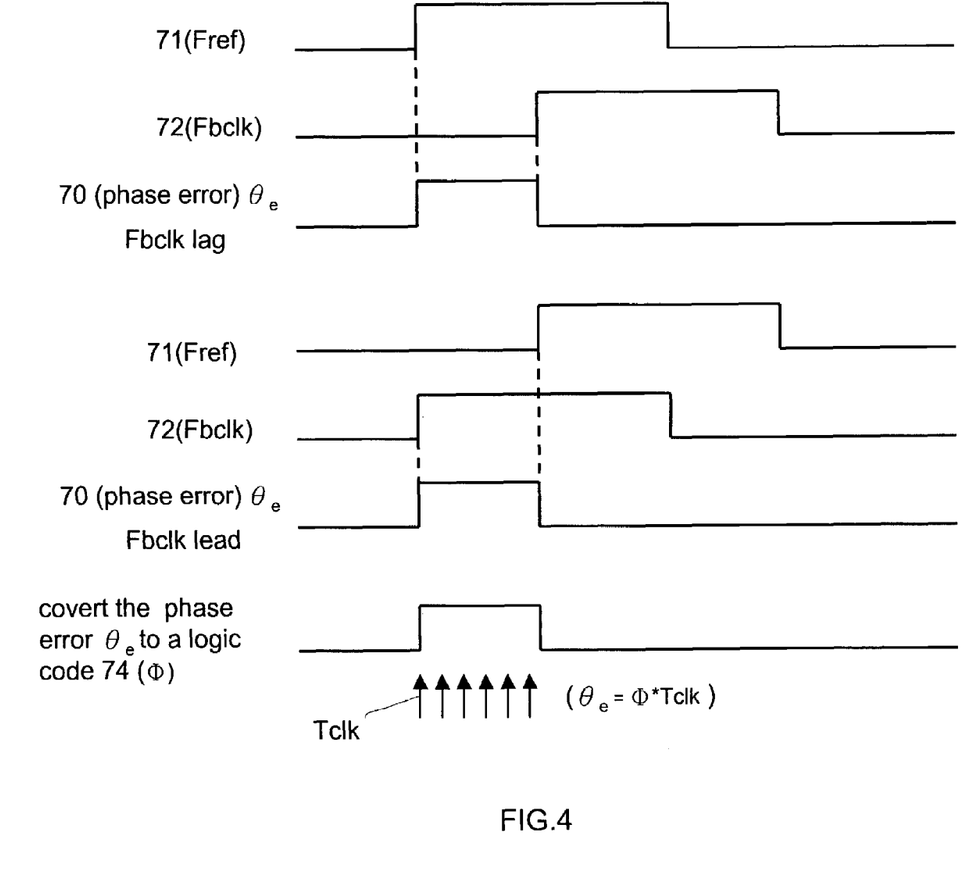
FIG. 4 is the relation between the phase error and digital representation code in the time-to-digital converter (TDC) in accordance with one embodiment of the present invention.

The digital converter 32, for example, may have a time-to-digital converter (TDC) 321. Referring FIG. 4 is the relation between the phase signal and digital representation code in the TDC 321 in accordance with one embodiment of the present invention. The TDC 321 is a device for converting the phase error signal $70(\theta_e)$ into a digital representation code 74 ($\Phi$). If $\theta_e$ is digitized by a Tclk, then $\theta_e$ is represented as $\Phi*Tclk$, where $\Phi$ is an integer.

The correction device 33 includes a phase correction circuit 332 receiving both controlling digital signals from the comparison device 31 and the digital converter 32 to generate a temporary number 338 (a first temporary number), and a frequency correction circuit 331 receiving both controlling digital signals from the comparison device 31 and the digital converter 32 to generate another temporary number 337 (a second temporary number). At the output end the correction device 33 generates the controlling digital signal 75 selectively based on these two temporary numbers.

Furthermore, the synthesizing device 34 includes a numerical controlled oscillator (NCO) 341 receiving the controlling digital signal 75 generated by the correction device 33 and a synthesizing reference clock signal 342 (Fsyn) to generate the output signal 76 of the PLL circuit. Alternatively, a digital controlled oscillator (DCO) may be utilized for synthesizing device. It is understood that the synthesizing reference clock signal is not necessary in use of the digital controlled oscillator.

Accordingly, one of features of the present invention is to provide self-test digital phase-locked loop offering considerable cost advantages over conventional testing method using analog test machine.

Figure 5:
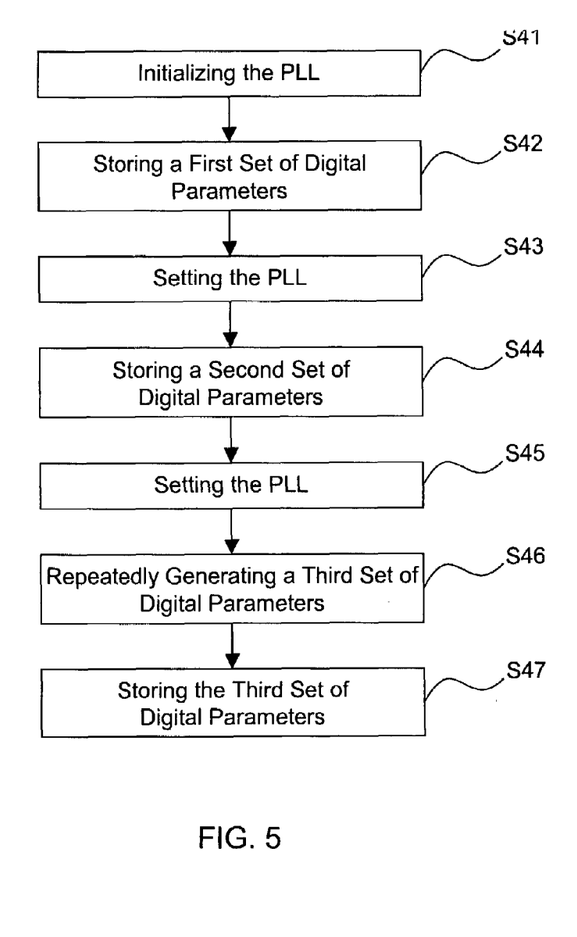
FIG. 5 is a method in accordance with one embodiment of the present invention.

Referring to FIG. 5, a method (or process) is shown in accordance with one embodiment of the present invention. The method includes the step S41 of initializing the PLL, the step S42 of storing a first set of digital parameters, the step S43 of setting the PLL, the step S44 of storing a second set of digital parameters, the step S45 of setting the PLL, the step S46 of repeatedly generating a third set of digital parameters and the step S47 of storing the third set of digital parameters.

Figure 6:
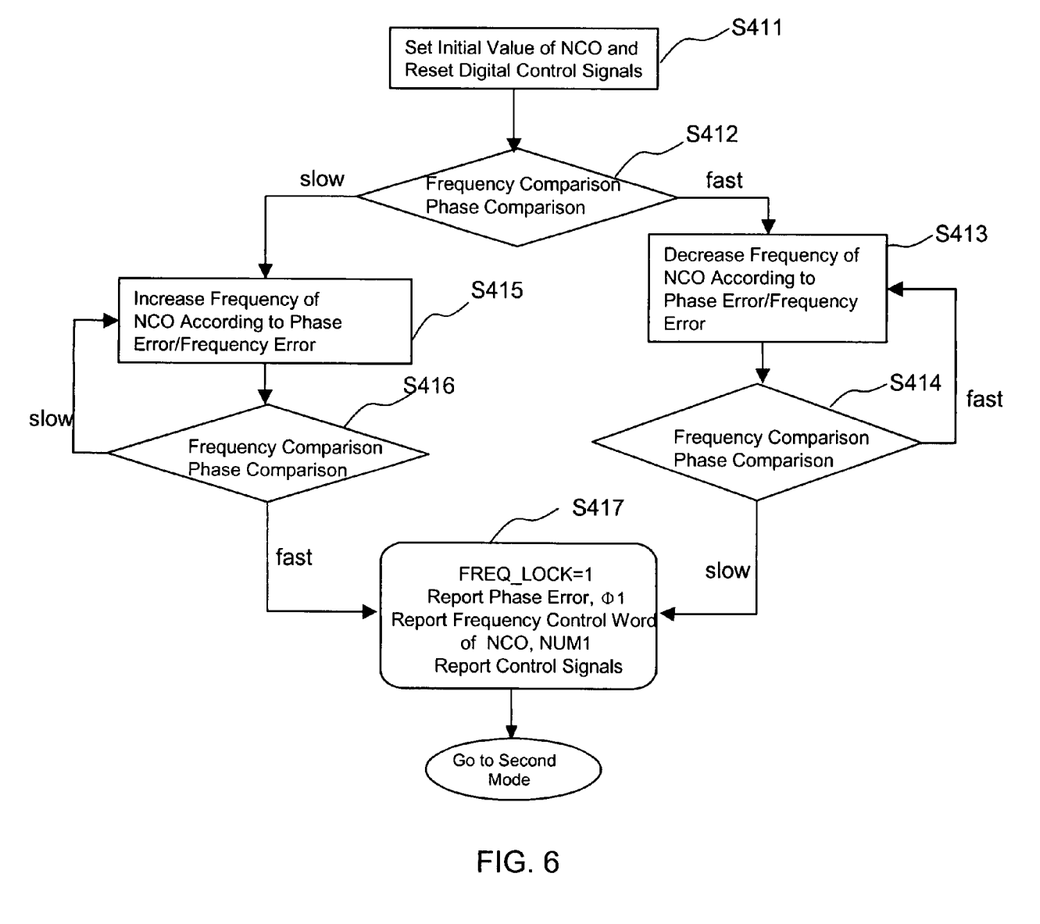
FIG. 6 is the first mode flowchart of operation shown in accordance with one embodiment of the present invention.

Referring to FIG. 6, the first mode flowchart of operation is shown in accordance with one embodiment of the present invention. The purpose of first mode operation is to make coarse frequency adjustment. In step S411, when initializing the PLL according to initial parameters, the initial value of NCO is set and digital control signals are reset. In step S412, making frequency and phase comparison between the input reference signal and an initial internal feedback signal generated by the PLL, if the result is "fast", for example, the internal feedback signal (Fbclk) faster than the input reference signal (Fref), then go to step S413 for decreasing the frequency of NCO according to phase error or frequency error, if the result is "slow", for example, the internal feedback signal (Fbclk) slower than input reference signal (Fref), then go to step S415 for increasing the frequency of NCO according to phase error or frequency error.

After step S413 or step S414 is taken, frequency and phase comparison are processed between the input reference signal and the adjusted internal feedback signal. If the result is "fast" then go back to step S413 to decrease the frequency of NCO according to phase error or frequency error, if the result is "slow" then go to next step S417.

If step S416 is taken, frequency and phase comparison are processed between the input reference signal and the adjusted internal feedback signal. If the result is "slow" then go back to step S415 to increase the frequency of NCO according to phase error or frequency error, if the result is "fast" then go to next step S417. After the first mode is finished, some information is made during the processing and stored in the register or memory, such as FREQ_LOCK=1, phase errors, frequency control words, and control signals, etc.

Thus, referring to FIG. 5, the first mode accomplishes step S41 initializing the PLL and step S42 storing a first set of digital parameters. The initial parameters set initial value of NCO and reset digital control signals. The data capture circuit (No. 22 in FIG. 2) stores digital parameters generated by the PLL after the frequency comparison result between the input reference signal and the internal feedback signal generated by the PLL satisfies a predetermined condition.

Figure 7:
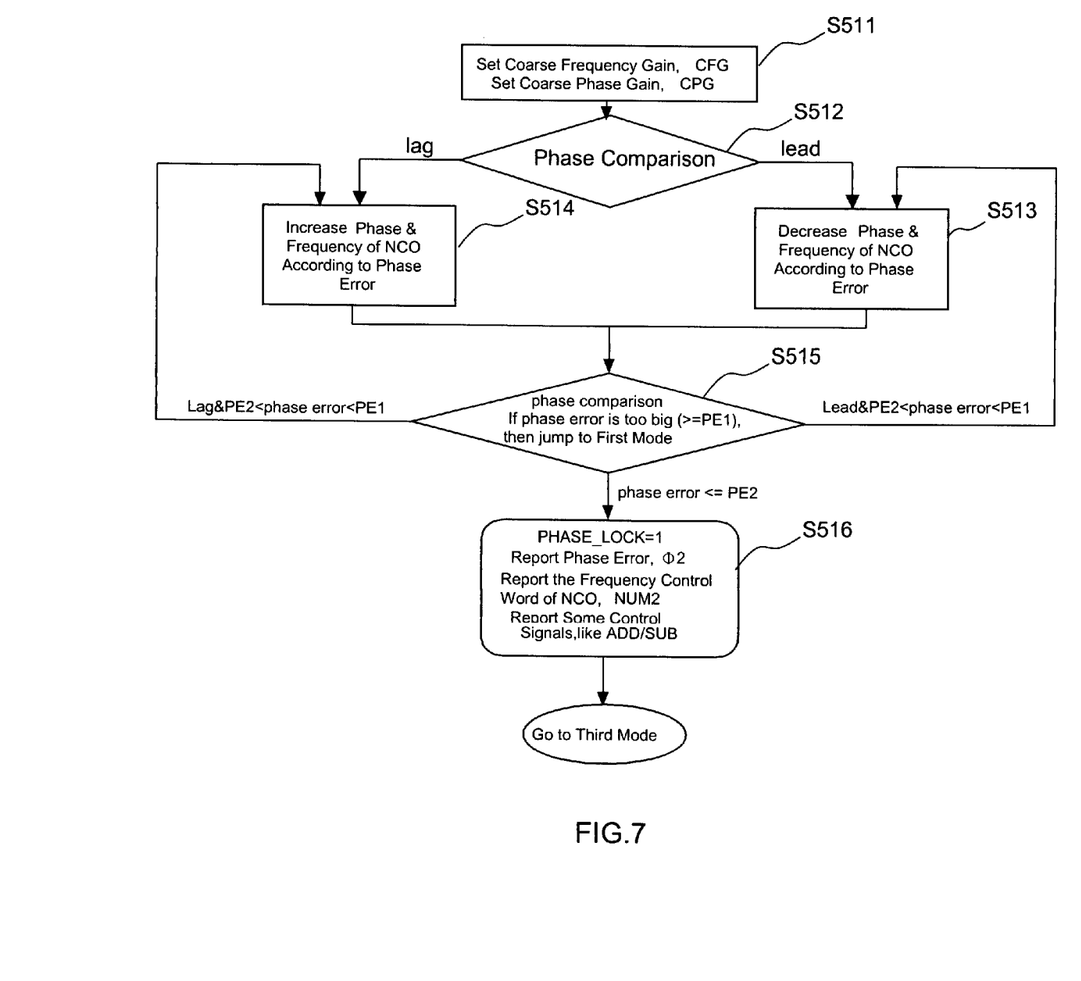
FIG. 7 is the second mode flowchart of operation shown in accordance with one embodiment of the present invention.

Referring to FIG. 7, the second mode flowchart of operation is shown in accordance with one embodiment of the present invention. The purpose of second mode operation is to make coarse phase and frequency adjustment. In step S511 set the coarse frequency gain CFG and coarse phase gain CPG. The frequency gain is used in the frequency correction circuit (No. 331 in FIG. 3), and the amount of frequency correction is proportional to frequency gain. In the same way, the phase gain is used in the phase correction circuit (No. 332 in FIG. 3), and the amount of phase correction is proportional to phase gain. In step S512 making phase comparison between the input reference signal and the internal feedback signal generated by the PLL, if the result is "lead", for example, internal feedback signal leading the input reference signal, then go to step S513 decreasing the frequency and the phase of NCO according to phase error, if the result is "lag", for example, internal feedback signal lagging the input reference signal, then go to step S514 increasing the frequency and phase of NCO according to phase error. Step 515 is processed after step S513 or S514. There are two boundary levels to determine the phase error, PE1 and PE2 where PE1 is bigger than PE2. If the phase error is bigger than PE1, then the process goes back to the first mode. If the phase is in leading situation and the phase error is between PE1 and PE2, then go to the step S513. If the phase is in lagging situation and the phase error is between PE1 and PE2, then go to the step S514. The last situation will be met if the phase error is smaller than PE2, and go to next step S516. After the second mode is finished some information been made during the processing. And the information will be stored in the register or memory, such as PHASE_LOCK=1, phase errors, frequency control words, control signals, etc.

Thus, referring to FIG. 5 the second mode accomplishes step S43 setting the PLL and step S44 storing a second set of digital parameters. The data capture circuit (No. 22 in FIG. 2) stores a set of digital parameters generated by the PLL after the phase comparison result between the input reference signal and an internal feedback signal generated by the PLL satisfies a predetermined condition.

Figure 8:
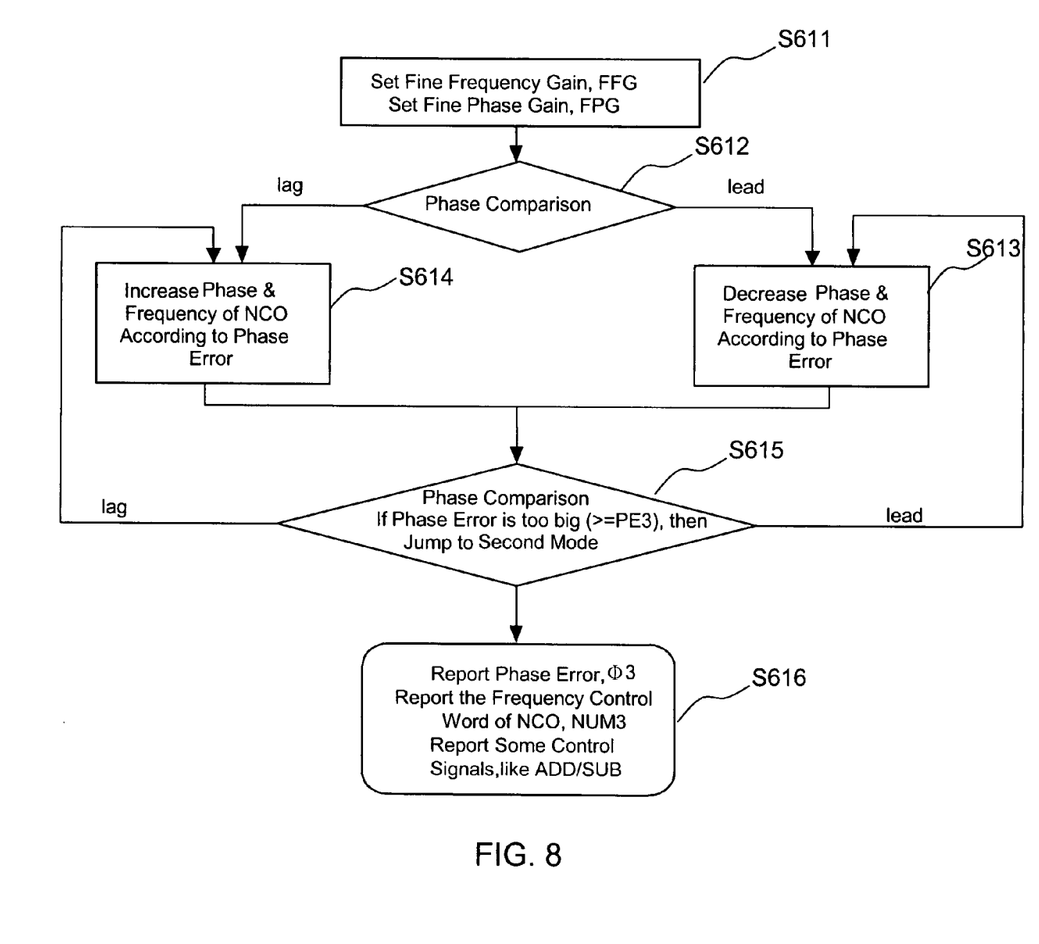
FIG. 8 is the third mode flowchart of operation shown in accordance with one embodiment of the present invention.

Referring to FIG. 8, the third mode flowchart of operation is shown in accordance with one embodiment of the present invention. The purpose of third mode operation is to make fine phase and frequency adjustment. In step S611 the fine frequency gain (FFG) and fine phase gain (FPG) are set. In step S612 making phase comparison between the input reference signal and the internal feedback signal generated by the PLL, if the result is "lead", for example, internal feedback signal leads the input reference signal, then go to step S613 to decrease the frequency and phase of NCO according to phase error, if the result is "lag", for example, internal feedback signal lags the input reference signal, then go to step S614 to increase the frequency and phase of NCO according to phase error. Step S615 is processed after step S613 or S614. There is a threshold value to determine the phase error, PE3. If the phase error is bigger than PE3, then the process goes back to the second mode. If the phase is in leading situation, go to step S613. If the phase is in lagging situation, then go to step S614. In the normal operation, the PLL will operate in the third mode for a long time. During the operation, the PLL repeatedly generates a set of digital parameters, and the information will be stored in the register or memory, such as phase errors, frequency control words, control signals, etc.

Thus, referring to FIG. 5 the third mode accomplishes step S45 setting the PLL, step S46 repeatedly generating a third set of digital parameters and step S47 storing a third set of digital parameters. The digital control unit sets the PLL according to a plurality of parameters. The PLL will repeatedly generate a set of digital parameters during a predetermined time period and stores digital parameters as a result.

Accordingly, one embodiment of the present invention provides a great deal of flexibility for adjusting the frequency and phase associated with three modes by making various digital parameters. Furthermore, one embodiment of the present invention provides an easy and non-tedious way to pin down bugs in the circuits by analyzing the digital data.

Although the present invention has been explained in relation to its preferred embodiment, it is to be understood that other modifications and variation can be made without departing the spirit and scope of the invention as hereafter claimed.

What is claimed is:

1. A self-test phase-locked loop (PLL), comprising:
    a comparison device for comparing an input reference signal with an internal feedback signal, and outputting at least a phase error signal and a first controlling digital signal;
    a digital converter for quantizing the phase error signal into a second controlling digital signal;
    a correction device for receiving the first and the second controlling digital signal and generating a third controlling digital signal;
    a synthesizing device generating an output signal based on the third controlling digital signal;
    a divider receiving the output signal and generating the internal feedback signal;
    a digital control unit for controlling the comparison device, the digital converter, the correction device, the synthesizing device and the divider; and
    a data capture circuit, the data capture circuit selectively capturing a set of digital parameters based on a set of criteria;
    wherein the set of digital parameters comprises the first, second, and third controlling digital signals.

2. The self-test phase-locked loop according to claim 1, wherein the comparison device comprises:
    a phase detector detecting the phase difference between the input reference signal with the internal feedback signal; and
    a frequency detector detecting the frequency difference between the input reference signal with the internal feedback signal, wherein the comparison device generates the phase error signal and the first controlling digital signal based on the detected phase difference and the detected frequency difference.

3. The self-test phase-locked loop according to claim 1, wherein the second controlling digital signal is generated from a time-to-digital converter.

4. The self-test phase-locked loop according to claim 1, wherein the correction device comprises:
    a phase correction circuit receiving the first controlling digital signal and the second controlling digital signal to generate a first temporary number; and
    a frequency correction circuit receiving the first controlling digital signal and the second controlling digital signal to generate a second temporary number;
    wherein the correction device generates the third controlling digital signal selectively based on the first and second temporary numbers.

5. The self-test phase-locked loop according to claim 1, wherein the synthesizing device comprises a numerical controlled oscillator receiving the third controlling digital signal and a synthesizing reference clock signal to generate the output signal.

6. The self-test phase-locked loop according to claim 1, wherein the synthesizing device comprises a digital controlled oscillator receiving the third controlling digital signal to generate the output signal.

7. A method of locking a phase-locked loop (PLL), comprising the steps of:
    (a) initializing the PLL according to a plurality of first initial parameters and an input reference signal;
    (b) storing a first set of digital parameters generated by the PLL after the frequency comparison result between the input reference signal and a first internal feedback signal generated by the PLL satisfying a first predetermined condition;
    (c) setting the PLL according to a plurality of second initial parameters;
    (d) storing a second set of digital parameters generated by the PLL after the phase comparison result between the input reference signal and a second internal feedback signal generated by the PLL satisfying a second predetermined condition;
    (e) setting the PLL according to a plurality of third initial parameters; and
    (f) repeatedly generating a third set of digital parameters generated by the PLL during a predetermined time period.

8. The method of locking a phase-locked loop of claim 7, further comprising:
    (g) storing the third set of digital parameters repeatedly generated by the PLL.

9. The method of locking a phase-locked loop of claim 7, wherein a plurality of first initial parameters includes a third controlling digital signal used to generate the initial output signal of the PLL.

10. The method of locking a phase-locked loop of claim 7, wherein a plurality of second initial parameters includes a frequency gain signal and a phase gain signal.

11. The method of locking a phase-locked loop of claim 7, wherein a plurality of third initial parameters includes a frequency gain signal and a phase gain signal.

12. The method of locking a phase-locked loop of claim 7, wherein the first predetermined condition in step (b) is satisfied when the frequency difference between the first feedback signal and the input reference signal is smaller than a first predetermined value.

13. The method of locking a phase-locked loop of claim 7, wherein the first predetermined condition in step (b) is satisfied when the frequency of the first internal feedback signal is from leading to lagging against that of the input reference signal, or when the frequency of the first internal feedback signal is from lagging to leading against that of the input reference signal.

14. The method of locking a phase-locked loop of claim 7, wherein the second predetermined condition in step (d) is satisfied when the phase difference between the second feedback signal and the input reference signal is smaller than a second predetermined value.

15. The method of locking a phase-locked loop of claim 7, wherein the second predetermined condition in step (d) is satisfied when the phase of the second internal feedback signal is from leading to lagging against that of the input reference signal, or when the phase of the second internal feedback signal is from lagging to leading against that of the input reference signal.

16. The self-test phase-locked loop of claim 1, further comprising a register or memory for storing the set of digital parameters.

* * * * *